US012640287B2

(12) United States Patent     (10) Patent No.:   US 12,640,287 B2
Zhang et al.     (45) Date of Patent:     May 26, 2026

(54) BUSBAR ASSEMBLY

(71) Applicants: TE Connectivity Solutions GmbH, Schaffhausen (CH); Tyco Electronics (Shanghai) Co., Ltd., Shanghai (CN)

(72) Inventors: Rong (Summer) Zhang, Shenzhen (CN); Jie (Roger) Luo, Shunde (CN); Hongqiang (Sean) Han, Shanghai (CN); Robert A. Patterson, Middletown, PA (US)

(73) Assignees: TE Connectivity Solutions GmbH, Schaffhausen (CH); Tyco Electronics (Shanghai) Co., Ltd., Shanghai (CN)

( * ) Notice: Subject to any disclaimer, the term of this patent is extended or adjusted under 35 U.S.C. 154(b) by 208 days.

(21) Appl. No.: 18/391,791

(22) Filed: Dec. 21, 2023

(65) Prior Publication Data

US 2024/0212887 A1     Jun. 27, 2024

(30) Foreign Application Priority Data

Dec. 23, 2022   (CN) ........................ 202211673182.X

(51) Int. Cl.
   *H01B 17/00*     (2006.01)
   *H01B 17/24*     (2006.01)
   *H05K 7/14*     (2006.01)
   *H01R 25/16*     (2006.01)

(52) U.S. Cl.
   CPC ........... *H01B 17/24* (2013.01); *H05K 7/1492* (2013.01); *H01R 25/162* (2013.01)

(58) Field of Classification Search
   CPC ..... H01B 17/24; H05K 7/1492; H01R 25/162
   See application file for complete search history.

(56) References Cited

U.S. PATENT DOCUMENTS

| | | | | |
|---|---|---|---|---|
| 3,104,276 | A | * | 9/1963 | Cataldo ................. H02G 5/007 |
| | | | | 174/88 B |
| 8,717,741 | B2 | * | 5/2014 | Valenzuela ............ H01R 35/04 |
| | | | | 361/624 |
| 2002/0185300 | A1 | * | 12/2002 | Rees ........................ H02G 5/00 |
| | | | | 174/149 B |
| 2015/0364878 | A1 | * | 12/2015 | Orris .................... H01R 13/113 |
| | | | | 439/55 |

* cited by examiner

*Primary Examiner* — Pete T Lee
(74) *Attorney, Agent, or Firm* — Barley Snyder

(57) ABSTRACT

A busbar assembly includes a first and a second busbar, an intermediate insulating member, an insulation mounting assembly, and a fastener. The busbars are arranged at an interval in a thickness direction of the busbar assembly. First and second through holes are formed in respective ones of the busbars. The intermediate insulating member is arranged between the first busbar and the second busbar. A third through hole is formed in the intermediate insulating member and is aligned with the corresponding through holes in the thickness direction. At least a portion of the insulation mounting assembly is inserted through the aligned first, second, and third through holes to fix the first busbar and the second busbar relative to the intermediate insulating member. The fastener is mounted at least partially within the insulation mounting assembly to fix the insulation mounting assembly, the intermediate insulating member, the first and second busbars.

19 Claims, 4 Drawing Sheets

150

BUSBAR ASSEMBLY

CROSS-REFERENCE TO RELATED APPLICATION

This application claims the priority benefit of Chinese Patent Application No. 202211673182.X filed on Dec. 23, 2022, the whole disclosure of which is incorporated herein by reference.

FIELD OF THE INVENTION

Embodiments of the present disclosure generally relate to the field of power distribution technology, and more specifically, to a busbar assembly adapted to connect an electric equipment to a power supply unit.

BACKGROUND

A busbar is used as a power path for electrical connections between multiple electrical apparatuses, for example for connecting an apparatus to a power supply unit in a distribution system. As an example, in a cabinet or switch cabinet of a data center, for example in a cabinet of the data center, a power supply or power supply unit (PSU) supplies power to various apparatuses or functional units via a busbar.

In a busbar assembly used in a power supply system, electrical isolation is carried out between a positive busbar and a negative busbar by an intermediate insulating member. In conventional technology, in order to secure the busbars, multiple misaligned through-holes are provided in the busbars to facilitate the mounting and securing of the insulating member. However, it is necessary to mold raised mounting posts on the intermediate insulating member, resulting in a decrease in the effective current carrying cross-sectional area of the busbar. In addition, the intermediate insulating member is a segmented injection molded member, which has a high mold cost and a greater difficulty in assembling.

SUMMARY

According to an embodiment of the present disclosure, a busbar assembly includes a first busbar and a second busbar, an intermediate insulating member, an insulation mounting assembly, and a fastener. The first and second busbars are arranged at an interval in a thickness direction of the busbar assembly. First and second through holes are formed in respective ones of the first and second busbars. The intermediate insulating member is arranged between the first busbar and the second busbar. A third through hole is formed in the intermediate insulating member and is aligned with the corresponding first and second through holes in the thickness direction. At least a portion of the insulation mounting assembly is inserted through the aligned first, second, and third through holes to fix the first busbar and the second busbar relative to the intermediate insulating member. The fastener is mounted at least partially within the insulation mounting assembly to fix the insulation mounting assembly, the intermediate insulating member, the first and second busbars.

BRIEF DESCRIPTION OF THE DRAWINGS

The invention will now be described by way of example with reference to the accompanying Figures, of which.

DETAILED DESCRIPTION OF THE EMBODIMENTS

Figure 1:
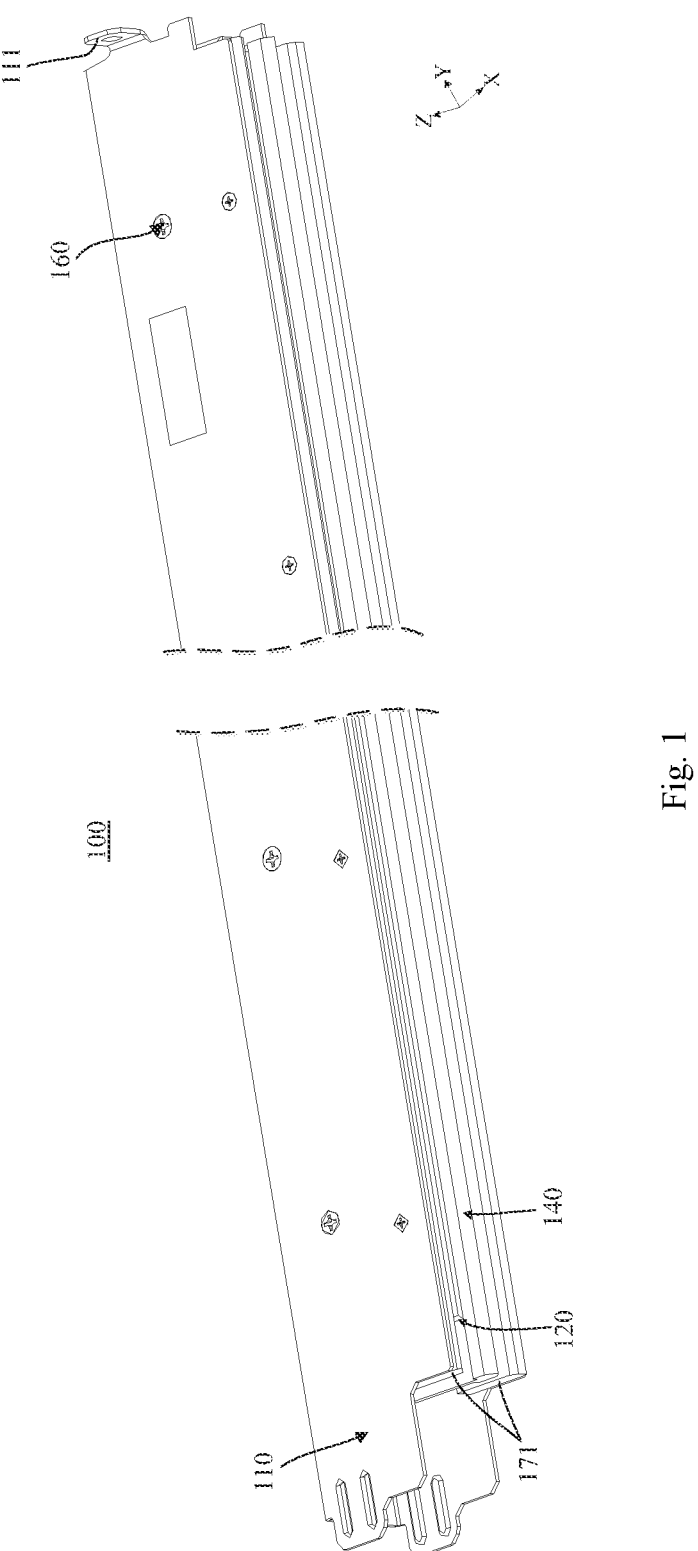
FIG. 1 is a schematic perspective view of a busbar assembly according to an exemplary embodiment of the present disclosure.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
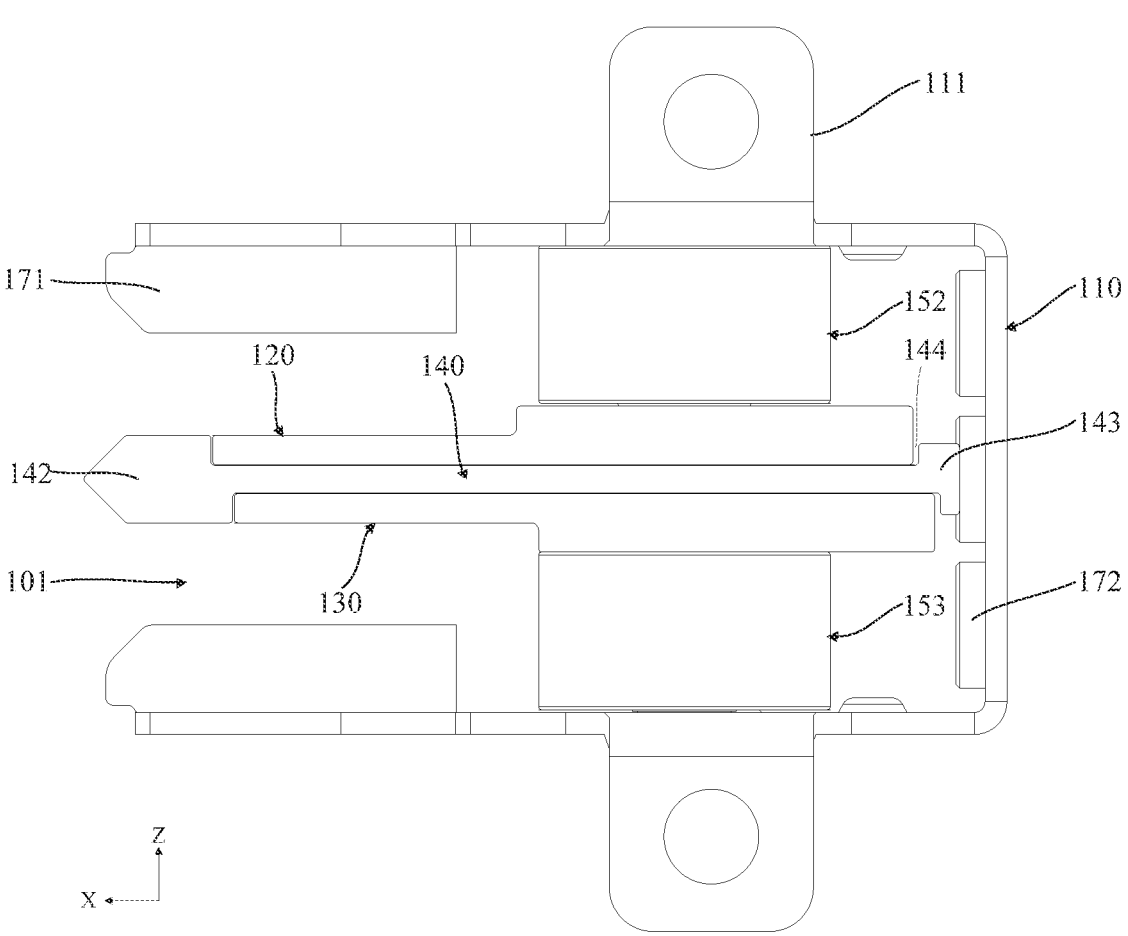
FIG. 2 is an end view schematically illustrating a structure of a busbar assembly according to an exemplary embodiment of the present disclosure.
Figure 3:
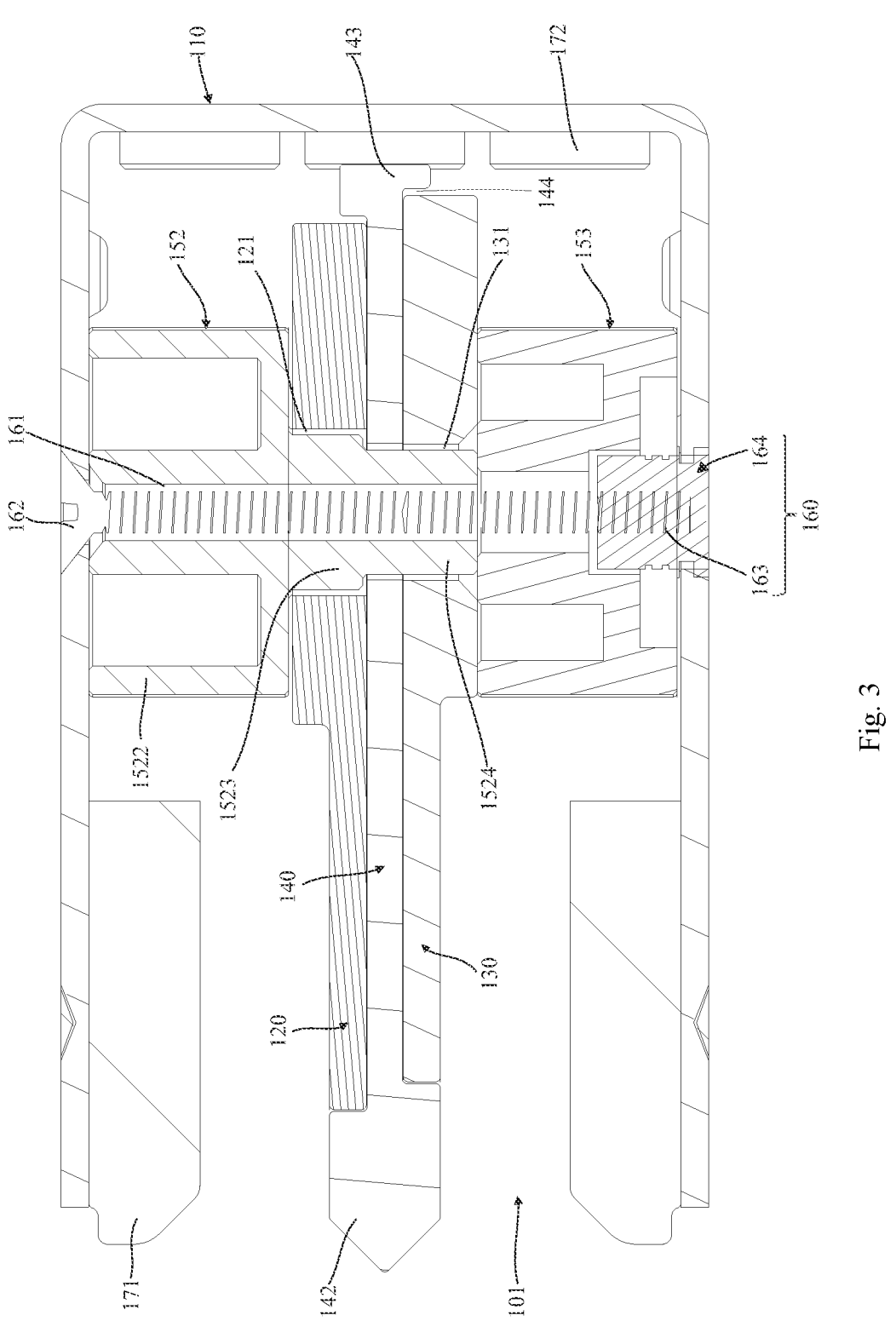
FIG. 3 is a cross-sectional view schematically illustrating a structure of a busbar assembly according to an exemplary embodiment of the present disclosure.

According to embodiments of the present disclosure, as shown in FIGS. 1-3, a busbar assembly 100 performs electrical/signal connections between a plurality of electrical apparatuses. For example, the busbar assembly 100 as provided may be used in a power distribution system to connect an electric apparatus to a power supply unit. As an example, the busbar assembly 100 as provided may be used in a cabinet or switch cabinet of a data center or server, for example used in a cabinet that meet industry standards, wherein a power supply or power supply unit (PSU) supplies power to various electrical apparatuses or functional units by the busbar assembly. For example, the busbar assembly 100 may be a vertical busbar assembly that is used in the cabinet to distribute power to various electrical apparatuses.

In the illustrated embodiment, the busbar assembly 100 includes a housing 110, a first busbar 120, a second busbar 130, and an intermediate insulating member 140 installed within the housing 110 in a stacked manner. The first busbar 120 and the second busbar 130 are spaced apart from each other in a thickness direction Z of the busbar assembly. The intermediate insulating member 140 is arranged between the first busbar 120 and the second busbar 130 to provide electrical isolation between the first busbar and the second busbar. The intermediate insulating member 140 may be a flat member molded from an insulating material.

For the vertical busbar assembly, each of the busbars has a length that extends in a vertical direction (for example, in a Y direction shown in the figures), a thickness in the thickness direction Z that is perpendicular to the length direction Y, and a width that extends in a horizontal X direction. The busbar may include a copper or aluminum busbar. As an example, the first busbar and the second busbar may be a positive busbar (including but not limited to a 48V power supply busbar) and a negative busbar for power distribution, respectively.

The housing 110 is elongated in the length direction Y, is provided at an end with a mounting portion 111 for mounting to the cabinet, and may have a substantially U-shaped cross-section, and the first busbar 120 and the second busbar 130 in the housing are exposed from an opening of the U-shaped housing. A cavity 101 is defined between the first busbar 120, the second busbar 130 and the housing 110, and a conductive terminal of an electrical connector or plug connected to the electrical apparatus or other busbar (such as a horizontal busbar) may be inserted into the cavity to be in electrical contact with the first busbar and the second busbar. In some examples, as shown in FIGS. 1-3, at a location near the opening of the housing 110, a liner insulator 171 with a certain thickness is provided on an inner wall of the housing facing the busbar to prevent the inserted conductive terminal from touching the inner wall of the housing.

Figure 4:
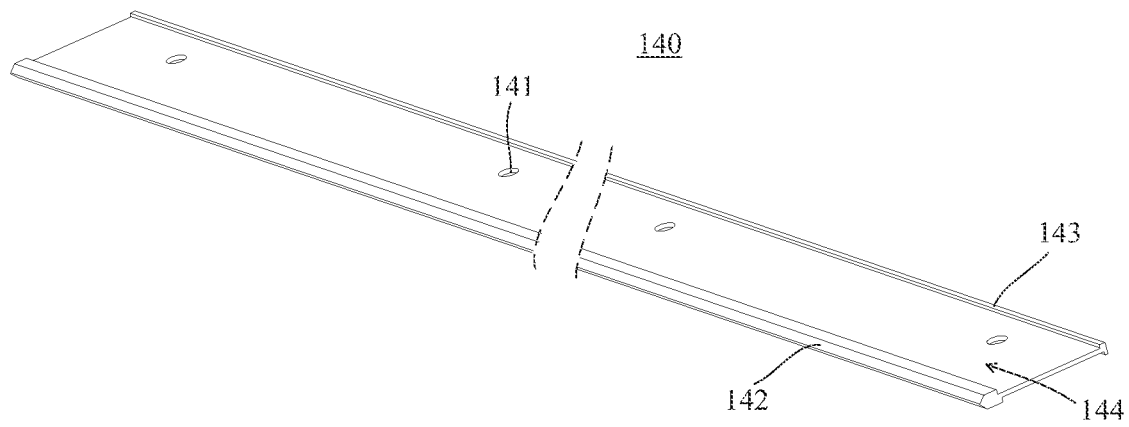
FIG. 4 is a perspective view schematically illustrating a structure of an intermediate insulating member of a busbar assembly according to an exemplary embodiment of the present disclosure.

According to exemplary embodiments of the present disclosure, as shown in FIGS. 1-3, the busbar assembly 100 further includes an insulation mounting assembly 150 (152, 153) and a fastener 160 for fixedly mounting the first busbar 120, the second busbar 130, and the intermediate insulating member 140 within the housing 110. As shown in FIGS. 3 and 4, a first through hole 121 is formed in the first busbar 120 and extends in the thickness direction Z, a second through hole 131 is formed in the second busbar 130 and extends in the thickness direction Z, and a third through hole 141 is formed in the intermediate insulating member 140 and extends in the thickness direction Z. After assembling, the corresponding first through hole 121, second through hole 131, and third through hole 141 are aligned with each other in the thickness direction Z. As described below, at least a portion of the insulation mounting assembly 150 is inserted through the aligned first through-hole 121, second through-hole 131, and third through-hole 141 to secure the first busbar 120 and second busbar 130 relative to the intermediate insulating member 140. The fastener 160 is at least partially mounted within the insulation mounting assembly 150 to secure the insulation mounting assembly 150, the intermediate insulating member 140, the first busbar 120, and the second busbar 130 relative to the housing 110.

Furthermore, the insulation mounting assembly 150 may be positioned at least partially between the first busbar 120, the second busbar 130 and the housing 110 in the thickness direction Z, for example may abut against the inner wall of the housing and a surface of the busbar, to provide electrical isolation between the busbar and the housing.

It should be understood that the numbers of the first through holes 121, the second through holes 131, and the third through holes 141 are not limited, and as required for mounting, the first through holes 121, the second through holes 131 and the third through holes 141 may each include multiple through holes spaced apart from each other in the length direction Y. Correspondingly, the number of the insulation mounting assemblies 150 and the fasteners 160 for securing may also be multiple. Unlike conventional technology where multiple pairs of holes are provided in the busbar to position the insulating member, the through holes formed in the busbar assembly provided according to embodiments of the present disclosure need not be misaligned or formed in pairs, which may significantly reduce the number of through holes in the busbar, increase the effective current-carrying cross-sectional area of the busbar, and improve the current carrying capacity.

In some embodiments, as shown in FIGS. 3 and 4, mounting grooves 144 are formed on opposite sides of the intermediate insulating member 140 in the thickness direction Z and extend in the length direction Y. The first busbar 120 and the second busbar 130 are at least partially positioned in the corresponding mounting grooves 144, respectively. As an example, a length and a width of the mounting groove match the length and width of the busbar, and the busbar positioned in the mounting groove may be limited in position in the width direction X by a side wall of the mounting groove. A depth of the mounting groove may be less than or equal to the thickness of the busbar.

In the busbar assembly 100 provided by the exemplary embodiments of the present disclosure, it is not necessary to, as in conventional technology, form a raised mounting post which is usually used for positioning the busbar on the intermediate insulating member. Rather, a bottom surface of the mounting groove 144 of the intermediate insulating member 140 is flat, and the third through hole 141 is formed in the bottom surface of the mounting groove to be communication with the mounting grooves 144 on either side thereof. In some embodiments, the intermediate insulating member 140 is an elongated one-piece or single member with a length approximately the same as that of the busbar, for example up to 2 meters. Thus, the intermediate insulating member may be molded by a simple mold, simplifying the design of the intermediate insulating member and significantly reducing mold costs.

As shown in FIGS. 2-4, the intermediate insulating member 140 has opposite first end 142 and second end 143 in the width direction X, the mounting groove 144 is defined between the first end 142 and the second end 143. Thicknesses of the first end 142 and the second end 143 are greater than that of the intermediate insulating member 140 at the mounting groove 144. In some embodiments, the second end 143 may abut against a bottom wall of the housing 110 either directly or via another liner insulator 172. The first bus bar 120 and the second bus bar 130 are spaced apart from the bottom wall of the housing 110 in the width direction X.

Figure 5:
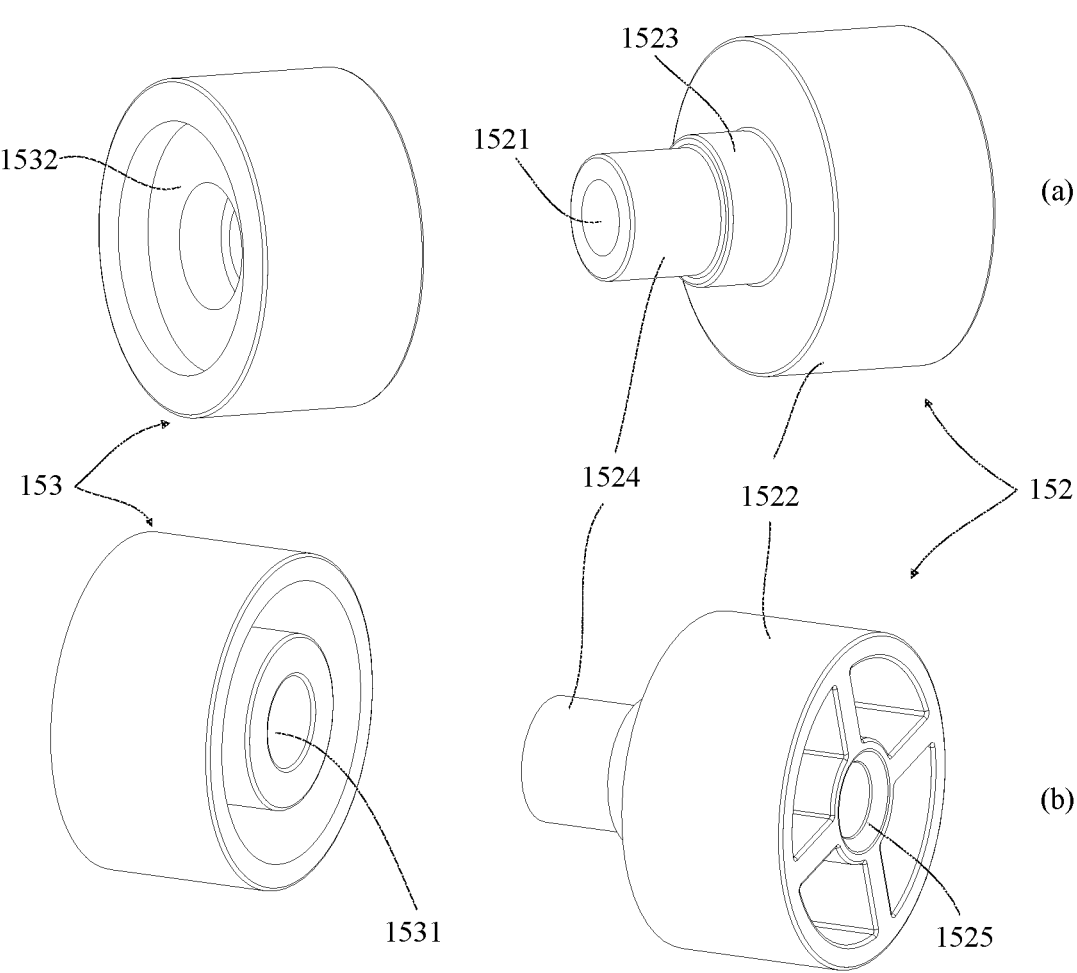
FIG. 5 is an exploded view illustrating a structure of an insulation mounting assembly of a busbar assembly according to an exemplary embodiment of the present disclosure.

In exemplary embodiments of the present disclosure, as shown in FIGS. 2, 3 and 5, each of the insulation mounting assemblies 150 includes a first sub mounting member 152 and a second sub mounting member 153 which are paired. At least a portion of one of the first sub mounting member 152 and the second sub mounting member 153 is inserted through the first through-hole 121, the second through hole 131 and the third through hole 141 aligned in the thickness direction Z and abuts against another paired sub mounting member in order to maintain the stacked first busbar 120, intermediate insulating member 140, and second busbar 130 together. Due to the insulation mounting assembly of the present disclosure adopts this paired structure, instead of using a misaligned design of two mounting insulating assemblies as in the conventional technology, the number of through holes is reduced, and assembly and maintenance are facilitated.

A first mounting hole 1521 is formed in the first sub mounting member 152, a second mounting hole 1531 is formed in the second sub mounting member 153. The first mounting hole 1521 and the second mounting hole 1531 are through holes extending in the thickness direction Z and aligned in the thickness direction Z during assembling. The fastener 160 is at least partially mounted in the aligned first mounting hole 1521 and second mounting hole 1531 to fasten the paired first sub mounting member 152 and second sub mounting member 153 together. Therefore, the insulation mounting assembly 150, and the first busbar 120, the intermediate insulating member 140, and the second busbar 130 held together by the insulation mounting assembly 150 are fixed together relative to the housing 110. In some examples, the first mounting hole 1521 and the second mounting hole 1531 are central through-holes formed in the first sub mounting member 152 and the second sub mounting member 152, respectively, and are aligned with the first through-hole 121, the second through-hole 131, and the third through-hole 141 in the thickness direction Z during assembling. This eliminates the need to form additional holes in the first busbar 120, the intermediate insulating member 140, and the second busbar 130 for a fastener to pass therethrough.

In the embodiments shown in FIGS. 2, 3, and 5, the first sub mounting member 152 includes a first base 1522. An insertion portion extending from the first base 152, opposite ends of the first base 1522 abut against the inner wall of the housing 110 and the surface of the first busbar 120, respectively, such that the first busbar 120 can be pressed against the intermediate insulating member 140 in the thickness direction Z. The insertion portion is inserted through the aligned first through-hole 121, second through hole 131 and third through hole 141, so that the relative positions among the first busbar 120, the intermediate insulating member 140, and the second busbar 130 are fixed in the length direction Y and the width direction X. Illustratively, the first base 1522 and the insertion portion may be in the form of a post with a central through hole. That is, the first mounting hole 1521 May extend through both the first base 1522 and the insertion portion in the thickness direction Z.

Opposite ends of the second sub mounting member 153 may also abut against the inner wall of the housing 110 and the surface of the second busbar 130, respectively. In this way, the second busbar 130 may be pressed against the intermediate insulating member 140 in the thickness direction Z. As an example, the second sub mounting member may be in the form of a base or main body formed therein with the second mounting hole 1531.

In some embodiments, as shown in FIGS. 2, 3, and 5, an outer diameter of the first base 1522 is greater than an inner diameter of the first through hole 121 and greater than an outer diameter of the insertion portion so that a first step is formed between the first base 1522 and the insertion portion. A step surface of the first step (i.e., a portion of a surface of the first base 1522 facing the first busbar 120) abuts against the surface of the first busbar 120, such that the first busbar 120 is clamped between the first base 1522 and the intermediate insulating member 140 in the thickness direction Z and is reliably limited in position.

In some embodiments, as shown in FIGS. 2, 3, and 5, the insertion portion of the second sub mounting member 153 may include a first sub insertion portion 1523 extending from the first base 1522 and a second sub insertion portion 1524 extending from the first sub insertion portion 1523. The first sub insertion portion 1523 is at least partially positioned in the first through hole 121, and the second sub insertion portion 1524 is at least partially positioned in the second through hole 131 and the third through hole 141. An outer diameter of the first sub insertion portion 1523 may be greater than an outer diameter of the second sub insertion portion 1524, so that a second step is formed between the first sub insertion portion 1523 and the second sub insertion portion 1524 and abuts against the surface of the intermediate insulating member 140.

The outer diameter of the second sub insertion portion 1524 May be greater than the inner diameter of the second mounting hole 1531 formed in the second sub mounting member 153, so that an end of the second sub insertion portion 1524 May be abutted against the surface of the second sub mounting member 153 facing the second busbar 130 at a position near the second mounting hole 1531. An end face of the second sub insertion portion 1524 May be roughly flush with a surface of the second busbar 130 facing the second sub mounting member 153 without protruding. In this way, the second busbar 130 may tightly be tightly pressed against the intermediate insulating member 140 by the second sub mounting member 153.

Various forms of fasteners may be adapted to fix the insulation mounting assembly, the intermediate insulating assembly, the first and second busbars inside the housing. In some embodiments, as shown in FIGS. 1 and 3, the fastener 160 includes a screw 161 and a nut 164, the screw 161 extends through the insulation mounting assembly 150, the first busbar 120, the intermediate insulating member 140 and the second busbar 130. For example, the screw 161 is inserted through the first mounting hole 1521 and the second mounting hole 1531 aligned in the thickness direction Z. The nut 164 is tightened onto the screw 161 to detachably fix the insulation mounting assembly 150, the first busbar 120, the intermediate insulating member 140 and the second busbar 130 within the housing 110.

As an example, the screw 161 may have a larger diameter head end 162 and a smaller diameter opposite end 163. The head end 162 may be positioned in a sink 1525 formed at an outer end of the first sub mounting member 152 and exposed from an outer surface of the housing 110. For example, the head end 162 is formed with a straight or cross groove for tool fastening or disassembly operations, while a sink 1532 is formed at an outer end of the second sub mounting member 153 to accommodate the nut 164. A ventilation hole may be formed in both the first and second sub mounting members for heat dissipation.

In addition, those areas in which it is believed that those of ordinary skill in the art are familiar, have not been described herein in order not to unnecessarily obscure the invention described. Accordingly, it has to be understood that the invention is not to be limited by the specific illustrative embodiments, but only by the scope of the appended claims.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of the elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A busbar assembly, comprising:
a first busbar and a second busbar arranged in a thickness direction of the busbar assembly, a first through hole being formed in the first busbar and a second through hole being formed in the second busbar;
an intermediate insulating member arranged between the first busbar and the second busbar, a third through hole being formed in the intermediate insulating member and aligned with the corresponding first and second through holes in the thickness direction, mounting grooves are formed on opposite sides of the intermediate insulating member in the thickness direction, the first bus bar and the second busbar being at least partially positioned in respective corresponding mounting grooves;
an insulation mounting assembly, at least a portion of the insulation mounting assembly being inserted through the aligned first through hole, second through hole, and third through hole and fixing the first busbar and the second busbar relative to the intermediate insulating member;
a fastener arranged at least partially within the insulation mounting assembly to fix the insulation mounting assembly, the intermediate insulating member, the first busbar and the second busbar; and
a housing, the first and second busbars being arranged at the interval in the thickness direction within the housing, the fastener fixing the insulation mounting assembly, the intermediate insulating member, the first busbar and the second busbar relative to the housing.

2. The busbar assembly according to claim 1, wherein a bottom surface of the mounting groove is flat and the third through hole is formed therethrough.

3. The busbar assembly according to claim 1, wherein the intermediate insulating member includes opposite first and second ends in a width direction perpendicular to the thickness direction, thicknesses of the first end and the second end are greater than that of the intermediate insulating member at the mounting groove, and the second end abuts against a bottom wall of the housing via a liner insulator.

4. The busbar assembly according to claim 1, wherein the intermediate insulating member is an elongated unitary member.

5. The busbar assembly according to claim 1, wherein the fastener comprises a screw and a nut, the screw extending through the insulation mounting assembly, the first busbar, the intermediate insulating member and the second busbar, and the nut being tightened onto the screw to fix the insulation mounting assembly, the intermediate insulating member, the first busbar and the second busbar within the housing.

6. The busbar assembly according to claim 1, wherein each of the insulating mounting assemblies comprises a first sub mounting member and a second sub mounting member which are paired, and at least a portion of one of the first sub mounting member and the second sub mounting member is inserted through the aligned first through hole, second through hole and third through hole and abutted against the other of the paired first and second sub mounting members.

7. The busbar assembly according to claim 6, wherein a first mounting hole is formed in the first sub mounting member and extends in the thickness direction, a second mounting hole is formed in the second sub mounting member and extends in the thickness direction, and the fastener is at least partially mounted in the first mounting hole and the second mounting hole aligned in the thickness direction.

8. The busbar assembly according to claim 6, wherein:
the first sub mounting member comprises a first base and an insertion portion extending from the first base, opposite ends of the first base abutting against an inner wall of the housing and a surface of the first busbar respectively, the insertion portion being inserted through the aligned first through hole, second through hole and third through hole; and
opposite ends of the second sub mounting member abut against the inner wall of the housing and a surface of the second busbar respectively.

9. The busbar assembly according to claim 8, wherein an outer diameter of the first base is greater than an inner diameter of the first through hole and greater than an outer diameter of the insertion portion, such that a first step is formed between the first base and the insertion portion and abuts against the surface of the first busbar.

10. The busbar assembly according to claim 8, wherein the insertion portion comprises a first sub insertion portion extending from the first base and a second sub insertion portion extending from the first sub insertion portion, the first sub insertion portion being at least partially positioned in the first through hole, the second sub insertion portion being at least partially positioned in the second through hole and the third through hole.

11. The busbar assembly according to claim 10, wherein an outer diameter of the first sub insertion portion is greater than an outer diameter of the second sub insertion portion, such that a second step is formed between the first sub insertion portion and the second sub insertion portion and abuts against the surface of the intermediate insulating member.

12. The busbar assembly according to claim 1, wherein the busbar assembly is a vertical busbar assembly used for power distribution in a cabinet, and the first busbar and the second busbar are a positive busbar and a negative busbar, respectively.

13. A busbar assembly, comprising:
a first busbar and a second busbar arranged in a thickness direction of the busbar assembly, a first through hole being formed in the first busbar and a second through hole being formed in the second busbar;
an intermediate insulating member arranged between the first busbar and the second busbar, a third through hole being formed in the intermediate insulating member and aligned with the corresponding first and second through holes in the thickness direction; and
an insulation mounting assembly, at least a portion of the insulation mounting assembly being inserted through the aligned first through hole, second through hole, and third through hole and fixing the first busbar and the second busbar relative to the intermediate insulating member, each of the insulating mounting assemblies comprises a first sub mounting member and a second sub mounting member which are paired, and at least a portion of one of the first sub mounting member and the second sub mounting member is inserted through the aligned first through hole, second through hole and third through hole and abutted against the other of the paired first and second sub mounting members.

14. The busbar assembly according to claim 13, further comprising a U-shaped housing, the first and second busbars being arranged at the interval in the thickness direction within the housing.

15. The busbar assembly according to claim 14, further comprising a fastener fixing the insulation mounting assembly, the intermediate insulating member, the first busbar and the second busbar relative to the housing.

16. The busbar assembly according to claim 14, wherein mounting grooves are formed on opposite sides of the intermediate insulating member in the thickness direction, the first bus bar and the second busbar being at least partially positioned in respective corresponding mounting grooves.

17. The busbar assembly according to claim 16, wherein a bottom surface of the mounting groove is flat and the third through hole is formed therethrough.

18. A busbar assembly, comprising:

a first busbar and a second busbar arranged in a thickness direction of the busbar assembly, a first through hole being formed in the first busbar and a second through hole being formed in the second busbar;

an intermediate insulating member arranged between the first busbar and the second busbar, a third through hole being formed in the intermediate insulating member and aligned with the corresponding first and second through holes in the thickness direction;

a plurality of insulation mounting assemblies, at least a portion of at least one of the insulation mounting assemblies being inserted through the aligned first through hole, second through hole, and third through hole and fixing the first busbar and the second busbar relative to the intermediate insulating member, each of the insulating mounting assemblies comprises a first sub mounting member and a second sub mounting member which are paired, and at least a portion of one of the first sub mounting member and the second sub mounting member is inserted through the aligned first through hole, second through hole and third through hole and abutted against the other of the paired first and second sub mounting members;

a fastener arranged at least partially within the insulation mounting assembly to fix the insulation mounting assembly, the intermediate insulating member, the first busbar and the second busbar; and a housing, the first and second busbars being arranged at the interval in the thickness direction within the housing, the fastener fixing the insulation mounting assembly, the intermediate insulating member, the first busbar and the second busbar relative to the housing.

19. A busbar assembly, comprising:

a first busbar and a second busbar arranged in a thickness direction of the busbar assembly, a first through hole being formed in the first busbar and a second through hole being formed in the second busbar;

an intermediate insulating member arranged between the first busbar and the second busbar, a third through hole being formed in the intermediate insulating member and aligned with the corresponding first and second through holes in the thickness direction, mounting grooves are formed on opposite sides of the intermediate insulating member in the thickness direction, the first bus bar and the second busbar being at least partially positioned in respective corresponding mounting grooves;

an insulation mounting assembly, at least a portion of the insulation mounting assembly being inserted through the aligned first through hole, second through hole, and third through hole and fixing the first busbar and the second busbar relative to the intermediate insulating member; and a U-shaped housing, the first and second busbars being arranged at the interval in the thickness direction within the housing.

* * * * *